(12) United States Patent
Guo et al.

(10) Patent No.: US 10,305,463 B2
(45) Date of Patent: May 28, 2019

(54) SELECTION CIRCUIT AND ELECTRONIC DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lei Guo, Beijing (CN); Shuai Xu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/507,749

(22) PCT Filed: May 20, 2016

(86) PCT No.: PCT/CN2016/082877
§ 371 (c)(1),
(2) Date: Feb. 28, 2017

(87) PCT Pub. No.: WO2017/121056
PCT Pub. Date: Jul. 20, 2017

(65) Prior Publication Data
US 2018/0309432 A1 Oct. 25, 2018

(30) Foreign Application Priority Data

Jan. 12, 2016 (CN) .......................... 2016 1 0017951

(51) Int. Cl.
H03K 17/00 (2006.01)
G06F 3/02 (2006.01)
H03K 19/20 (2006.01)

(52) U.S. Cl.
CPC ......... *H03K 17/002* (2013.01); *G06F 3/0227* (2013.01); *H03K 19/20* (2013.01)

(58) Field of Classification Search
CPC ..... H03K 17/002; H03K 19/20; G06F 3/0227
See application file for complete search history.

(56) References Cited

U.S. PATENT DOCUMENTS 5,687,296 A * 11/1997 Shimada ................ G06K 15/02
358/1.13
5,748,982 A * 5/1998 Smith .................. G06F 13/4068
710/3

(Continued)

FOREIGN PATENT DOCUMENTS

CN 1713121 A 12/2005
CN 101056102 A 10/2007

OTHER PUBLICATIONS

Chinese Office Action dated Jan. 30, 2018 in corresponding Chinese application No. 201610017951.9.

(Continued)

*Primary Examiner* — Kenneth B Wells
(74) *Attorney, Agent, or Firm* — Syncoda LLC; Feng Ma

(57) ABSTRACT

A selection circuit includes at least three control terminals; wherein: a first group of the at least three control terminals is configured to provide a first signal for controlling a first function; and a second group of the at least three control terminals is also configured to provide a second signal for controlling the first function.

14 Claims, 3 Drawing Sheets

(56) References Cited

U.S. PATENT DOCUMENTS

| | | | | |
|---|---|---|---|---|
| 6,348,915 B1 * | 2/2002 | Yamashita | .......... | G06F 13/4217 |
| | | | | 345/204 |
| 6,937,527 B1 * | 8/2005 | Lotz | .................... | H03K 3/0375 |
| | | | | 327/199 |
| 2005/0280560 A1 | 12/2005 | Moon et al. | | |

OTHER PUBLICATIONS

International Search Report and Written Opinion dated Oct. 12, 2016 in PCT/CN2016/082877.

* cited by examiner

SELECTION CIRCUIT AND ELECTRONIC DEVICE

CROSS-REFERENCES TO RELATED APPLICATION

The present application claims priority to Chinese Patent Application No. 201610017951.9 filed on Jan. 12, 2016, the disclosure of which is hereby incorporated by reference in its entirety.

TECHNICAL FIELD

The present disclosure relates to the field of electronic circuit technologies, and more specifically to a selection circuit and an electronic device.

BACKGROUND

As the electronics industry progresses, a variety of electronic products have become indispensable. Most electronic apparatuses are provided with function keys, through which different functions can be achieved. These function keys can be physical keys, or can be soft keys on a touch screen. Usually one function is achieved through only one function key. Taking a mobile phone for an example, turning on the power can only be achieved through the power on/off function key. Turning up the volume can only be achieved through the volume up function key, and lowering the volume can only be achieved through the volume down function key.

SUMMARY

The inventors of the present disclosure have recognized that if one of the function keys is broken, its corresponding function may not be achieved unless the electronic apparatus is repaired, and the entire electronic apparatus may become useless. Accordingly, embodiments of the present disclosure provide an electronic circuit and an electronic device to avoid the problem that the function of the electronic device cannot be achieved when one of the function keys in the electronic device is broken.

In an aspect, a selection circuit is provided, comprising: at least three control terminals; wherein: a first group of the at least three control terminals is configured to provide a first signal for controlling a first function; and a second group of the at least three control terminals is also configured to provide a second signal for controlling the first function.

In some embodiments, the first group comprises only one of the at least three control terminals, and wherein the second group comprises at least two other control terminals of the at least three control terminals.

In some embodiments, the selection circuit includes: N selection modules; N control terminals; and N enable terminals corresponding respectively to the N selection modules; wherein: N is an integer greater than or equal to 3; for each of the N selection modules, among the N control terminals only one control terminal is a corresponding first control terminal, at least two other control terminals are corresponding second terminals; wherein different selection modules correspond to different first control terminals, different selection modules correspond to different combinations of second control terminals; each selection module is configured to enable the corresponding enable terminal if only one of the following satisfies: the corresponding first control terminal receives an "on" signal, or each of the corresponding second control terminals receives an "on" signal.

In some embodiments, each selection module corresponds to a same number of second control terminals.

In some embodiments, N−1 second control terminals correspond to each selection module.

In some embodiments, each of the N selection modules comprises: a NOT gate, an OR gate, a first AND gate, and a second AND gate; wherein the first AND gate and the second AND gate each has N input terminals; for an n-th selection module with n being an integer between 1 and N: the corresponding first control terminal is respectively coupled with the input terminal of the NOT gate of the n-th selection module, the n-th input terminal of the first AND gate of the n-th selection module, and the n-th input terminal of the second AND gate of the selection modules other than the n-th selection module; the output terminal of the NOT gate of the n-th selection module is respectively coupled with the n-th input terminal of the second AND gate of the n-th selection module, and the n-th input terminal of the first AND gate of selection modules other than the n-th selection module; the output terminal of the first AND gate of n-th selection module is coupled with the first input terminal of the OR gate of the n-th selection module, the output terminal of the second AND gate of n-th selection module is coupled with the second input terminal of the OR gate of the n-th selection module, the output terminal of the OR gate is coupled with the enable terminal corresponding to the n-th selection module.

In some embodiments, N=3.

In some embodiments, the number of second control terminals correspond to each selection module is two.

In some embodiments, each enable terminal is configured to be enabled through at least two methods including: engaging corresponding first control terminal and disengaging all the second control terminals; or disengaging corresponding first control terminal and engaging all corresponding second control terminals.

In some embodiments, the n-th selection terminal is the corresponding first control terminal of the n-th selection module; N=3; a state of enable terminal Out_1 is a'; a state of enable terminal Out_2 is b'; a state of enable terminal Out_3 is c'; a state of control terminal In_1 is a; a state of control terminal In_2 is b; a state of control terminal In_1 is c; state logic function expressions of the enable terminals and the control terminals include: $a'=a\bar{b}\bar{c}+\bar{a}bc$, $b'=\bar{a}b\bar{c}+a\bar{b}c$, $c'=\bar{a}\bar{b}c+ab\bar{c}$.

In another aspect, an electronic device is provided, comprising: at least N function keys; a selection circuit of any one of claims 1-10; wherein each of the control terminals of the selection circuit corresponds to one of the function keys.

In some embodiments, the electronic device comprises at least one of a mobile phone, a laptop computer, or a tablet computer.

In some embodiments, the electronic device is a mobile phone.

In some embodiments, for N=3, the three control terminals of the selection circuit correspond respectively to a volume up function key, a volume down function key, and a power on/off function key.

In some embodiments, the volume up function key, the volume down function key, and the power on/off function key are physical keys.

In some embodiments, the volume up function key, the volume down function key, and the power on/off function key are soft keys on a touch screen of the electronic device.

In another aspect, a method of controlling an electronic apparatus is provided, wherein the electronic apparatus has at least three function keys, the method comprising: selecting at least two function keys of the at least three function keys to realize a first function of a first function key; wherein the first function corresponds to the first function key.

In some embodiments, each of the at least three function keys corresponds to different functions.

In some embodiments, the at least three function keys correspond respectively to a volume up function, a volume down function, and a power on/off function.

In some embodiments, the method further comprising selecting both the volume up function key and the volume down function key to realize the power on/off function.

Other embodiments and implementations may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), without any inventive work, which come(s) within the scope sought for protection by the disclosure.

Figure 1:
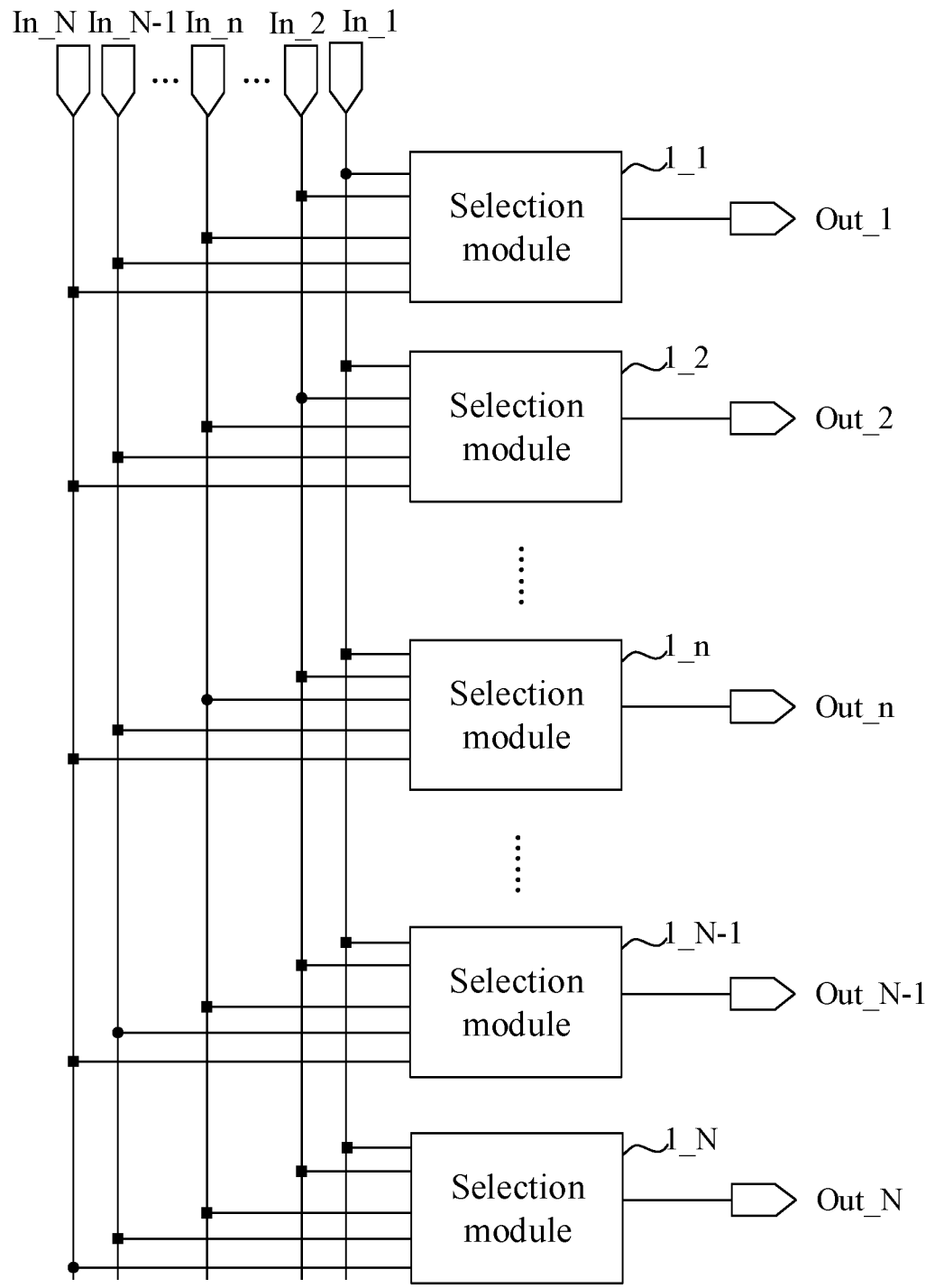
FIG. 1 is a schematic view of a selection circuit according to some embodiments.

As illustrated in FIG. 1, a selection circuit provided by embodiments of the present disclosure comprises: N selection modules: $1\_1, 1\_2, \ldots 1\_n, \ldots, 1\_N$; N control terminals: $In\_1, In\_2, \ldots, In\_n, \ldots, In\ N-1, In\_N$, and a plurality of enable terminals $Out\_1, Out\_2, \ldots, Out\_n, \ldots, Out\_N$, respectively corresponding to the N selection modules; wherein, N is an integer greater than and equal to 3.

For each of the selection modules $1\_n$, among the N control terminals $(In\_1, In\_2, \ldots, In\_n, \ldots, In\_N)$, only one control terminal $In\_n$ is the corresponding first control terminal, at least two other control terminals are the corresponding second control terminals. Moreover, different selection modules $1\_n$ correspond to different first control terminals, and different selection modules $1\_n$ correspond to different combinations of second control terminals.

Each of the selection modules $1\_n$ enables the enable terminal corresponding to the selection module $1\_n$ only if the corresponding first control terminal receives an "on" signal, or only if each of the corresponding second control terminals receives an "on" signal.

It should be noted that, in FIG. 1 a control terminal with a circular dot representing a connection is a first control terminal, and a control terminal with a square dot representing a connection is a second control terminal.

The selection circuit according to some embodiments comprises: N selection modules, N control terminals, and a plurality of enable terminals corresponding respectively to the N selection modules; wherein, N is an integer greater than or equal to 3.

For each selection module, N control terminals have one and only one control terminal as the corresponding first control terminal, and among the rest of the control terminals, at least two control terminals are the corresponding second control terminal. Different selection modules correspond to different first control terminals, and different selection modules correspond to different combinations of second control terminals.

Each selection module enables the enable terminal corresponding to the selection module not only when the first control terminal receives an "on" signal, but also when all the corresponding second control terminals receive a start terminal in the case that the first control terminal corresponding to the selection module is broken. As such, the same function can be achieved even if the first control terminal corresponding to the selection module is broken.

It should be noted that, in the selection circuit according to some embodiments, different combinations of second control terminals corresponding to different selection modules refers to that for any two second control modules, their respectively corresponding selection modules are not possible to be exactly the same.

In some embodiments of the selection circuit, the number of the second control terminals corresponding to each selection module is the same. This allows the number of wires for each selection module to be the same, and the structures of each selection module can be the same. As such, the selection modules can be more conveniently produced.

In the selection circuit according to some embodiments, each selection module corresponds to N−1 second control terminals. That is, for each selection module, among the N control terminals, only one control terminal is the corresponding first control terminal, and all the other control terminals are the corresponding second terminals.

As such, each enable terminal can be enabled through two methods. In the first method, the corresponding first control terminal receives an "on" signal, and all the second control terminals receive an "off" signal. In the second method, the corresponding first control terminal receives an "off" signal, and all of the corresponding second control terminals receive an "on" signal.

For example, in the case that the n-th selection terminal is the corresponding first control terminal of the n-th selection module and N=3, assuming the state of the enable terminal $Out\_1$ is a', the state of the enable terminal $Out\_2$ is b', the state of the enable terminal $Out\_3$ is c', the state of the control terminal $In\_1$ is a, the state of control terminal $In\_2$ is b, the state of the control terminal $In\_1$ is c, the state logic function expressions of the enable terminals and the control terminals are: $a'=a\bar{b}\bar{c}+\bar{a}bc$, $b'=\bar{a}b\bar{c}+a\bar{b}c$, $c'=\bar{a}\bar{b}c+ab\bar{c}$.

Figure 2:
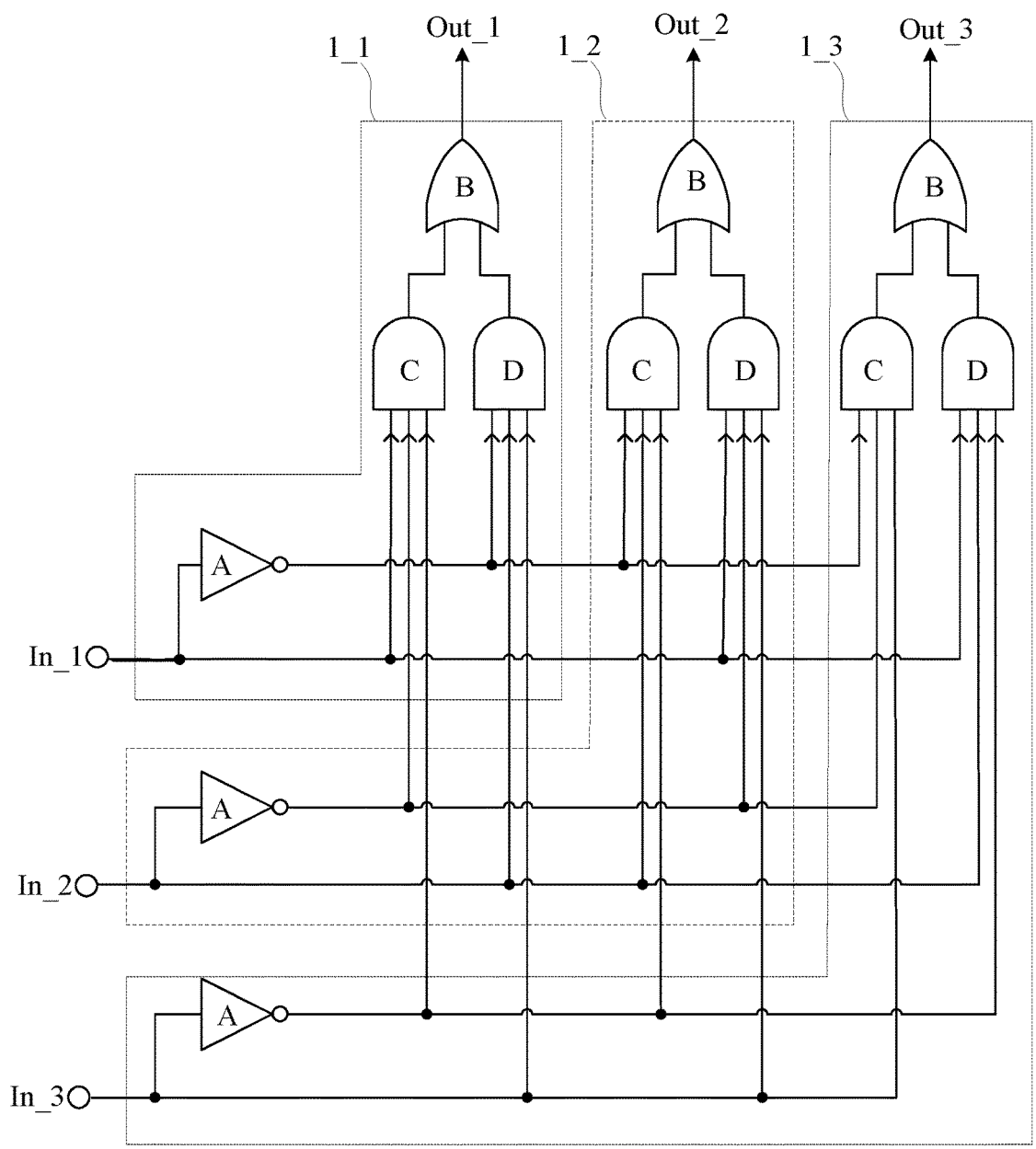
FIG. 2 is a schematic view of some details of a selection circuit according to some embodiments.

In some embodiments of the selection circuit, as illustrated in FIG. 2, taking N=3 as an example, each of the selection modules $1\_1$, $1\_2$, and $1\_3$ comprises: a NOT gate, an OR gate, a first AND gate, and a second AND gate; wherein, the first AND gate and the second AND gate each has N input terminals; for the n-th selection module $1\_n$, n is an integer between 1−N. In the example illustrated in FIG. 2 with N=3, n can be 1, 2, or 3.

The corresponding first control terminal, which in the example illustrated in FIG. 2 is the n-th control terminal In_n corresponding to the n-th selection module 1_n, is respectively coupled with the input terminal of NOT gate A of the n-th selection module 1_n, the n-th input terminal of the first AND gate C of the n-th selection module, and the n-th input terminal of the second AND gate D of selection modules other than the n-th selection module 1_n.

The output terminal of the NOT gate A of the n-th selection module 1_n is respectively coupled with the n-th input of the second AND gate D of the n-th selection module 1_n, and the n-th input terminal of the first AND gate C of selection modules other than the n-th selection module 1_n.

The output terminal of the first AND gate C of the n-th selection module 1_n is coupled with the first input terminal of the OR gate B of the n-th selection module 1_n, the output terminal of the second AND gate D of the n-th selection module 1_n is coupled with the second input terminal of the OR gate B of the n-th selection module 1_n, the output terminal of the OR gate B is coupled with the enable terminal Out_n corresponding to the n-th selection module 1_n:

It is noted that the above-described structures of the selection module are for illustration purpose only, and the selection modules according to embodiments disclosed herein are not limited to the illustrative structures.

Because the larger the value of N is, the more complex the structure of the whole selection circuit becomes, in some embodiments, N is predetermined to be 3. Such a relatively simple selection circuit can be set only for frequently-used function keys in electronic devices.

In some embodiments, the selection circuit has two second control terminals corresponding to each of the selection modules. Because when the selection circuit is employed by an electronic device, each control terminal corresponds to one function key, therefore, the more the second control terminals corresponding to each selection module, the more number of function keys need to be pressed at the same time to engage corresponding enable terminals, and it becomes cumbersome to operate In the following, using the selection circuit as shown in FIG. 2 as an example, the working principles of the selection circuit according to some embodiments are described, wherein "1" denotes the "on" signal and "0" denotes the "off"

In the first case, when In_1=1, In_2=0, In_3=0:

For the first selection module 1_1, the signal of each of the three input terminals of its first AND gate is "1." Therefore, the signal of the output terminal of the first AND gate C, i.e., the input terminal of the OR gate B is "1;" the signal of each of the three input terminals of the AND gate is "0," therefore the signal of the output terminal of the second AND gate D, i.e., the second input terminal of the OR gate B is "0." Because the signals of the two input terminals of the OR gate B are respectively "1," and "0," the signal of the output terminal of the OR gate B, i.e., the enable terminal Out_1 corresponding to the first selection module 1_1 is "1," i.e., the enable terminal Out_1 corresponding to the first selection module 1_1 is enabled.

For the second selection module 1_2, the signal of each of the three input terminals of its first AND gate C is respectively "0," "0," and "1." Therefore, the signal of the output terminal of the first AND gate C, i.e., the first input terminal of the OR gate B is "0;" the signals of three input terminals of the second AND gate D are respectively "1," "1," and "0." Therefore, the signal of the output terminal of the second AND gate D, i.e., the second input terminal of the OR gate B is "0." Because the signals of the two input terminal of the OR gate B are both "0," the signal of the output terminal of the OR gate B, i.e., the signal of the enable terminal Out_2 corresponding to the second selection module 1_2 is "0," i.e., the enable terminal Out_2 corresponding to the second selection module 1_2 is not enabled.

For the third selection module 1_3, the signals of the three input terminals of the first AND gate C are respectively "0," "1," and "0." Therefore, the signal of the output terminal of the first AND gate C, i.e., the first input terminal of the OR gate B is "0;" the signals of the three input terminals of the second AND gate D are respectively "1," "0," and "1." Therefore, the signal of the output terminal of the second AND gate D, i.e., the signal of the second input terminal of the OR gate B is "0;" because the signals of the two input terminals of the OR gate B are both "0," the signal of the output terminal of the OR gate B, i.e., the enable terminal Out_3 corresponding to the third selection module 1_3 is "0," i.e., the enable terminal Out_3 corresponding to the third selection module 1_3 is not enabled.

Specifically, the signal of each of the gates of each of the modules is shown in the following table 1.

TABLE 1

| In_1 = 1 | | | | | | In_2 = 0 | | | | | | In_3 = 0 | | | | | |
|---|---|---|---|---|---|---|---|---|---|---|---|---|---|---|---|---|---|
| 1_1 | | | | | | 1_2 | | | | | | 1_3 | | | | | |
| c1 | c2 | c3 | d1 | d2 | d3 | c1 | c2 | c3 | d1 | d2 | d3 | c1 | c2 | c3 | d1 | d2 | d3 |
| 1 | 1 | 1 | 0 | 0 | 0 | 0 | 0 | 1 | 1 | 1 | 0 | 0 | 1 | 0 | 1 | 0 | 1 |
| b1 | | | b2 | | | b1 | | | b2 | | | b1 | | | b2 | | |
| 1 | | | 0 | | | 0 | | | 0 | | | 0 | | | 0 | | |
| Out_1 | | | | | | Out_2 | | | | | | Out_3 | | | | | |
| 1 | | | | | | 0 | | | | | | 0 | | | | | |

In the second case: when In_1=0, In_2=1, In_3=1:

For the first selection module 1_1, signals of the three input terminals of its first AND gate C are all "0," therefore the signal of the output terminal of the first AND gate C, i.e. the first input terminal of the OR gate B is "0;" the signals of the three input terminals of the second AND gate D are all "1." Therefore, the signal of the output terminal of the second AND gate D, i.e., the second input terminal of the OR gate B is "1;" because the signals of the two input terminals of the OR gate B are respectively "0" and "1," the signal of the output terminal of the OR gate B, i.e., the enable terminal Out_1 corresponding to the first selection module 1_1 is "1," i.e., the enable terminal Out_1 corresponding to the first selection module 1_1 is enabled.

For the second selection module 1_2, the signals of the three input terminals of its first AND gate C are respectively "1," "1," and "0," therefore the signal of the output terminal of the first AND gate C, i.e., the first input terminal of the OR gate B is "0," the signals of the three input terminals of the second AND gate D are respectively "0," "0," and "1," therefore the output terminals of the second AND gate D, i.e., the second input terminal of the OR gate B is "0." Because the signals of the two input terminals of the OR gate B are all "0," the signal of the output terminal of the OR gate B, i.e., the enable terminal Out_2 corresponding to the second selection module 1_2 is "0," i.e., the enable terminal Out_2 corresponding to the second selection module 1_2 is not enabled.

For the third selection module 1_3, the signals of the three input terminals of its first AND gate C are respectively "1," "0" and "1," therefore the output terminal of the first AND gate C, i.e., the first input terminal of the OR gate B is "0;" the signals of the three input terminals of the second AND gate D are respectively "0," "1," "0," therefore the signals of the output terminal of the second AND gate D, i.e., the second input terminal of the OR gate B is "0;" because the signals of the two input terminals of the OR gate B are all "0," the signal of the output terminal of the OR gate B, i.e., the enable terminal Out_3 corresponding to the third selection module 1_3 is "0," i.e., the enable terminal Out_3 corresponding to the third selection module 1_3 is not enabled.

Specifically, the signal of the input terminals of each gate of each of the selection module is shown in table 2 below.

gate B is "0;" the signals of the three input terminals of the second AND gate D are respectively "1," "1," and "0." Therefore, the signal of the output terminal of the second AND gate D, i.e., the second input terminal of the OR gate B is "0;" because the signals of the two input terminals of the OR gate B are all "0," the signal of the output terminal of the OR gate B, i.e., the enable terminal Out_1 corresponding to the first selection module 1_1 is "0," i.e., the enable terminal Out_1 corresponding to the first selection module 1_1 is not enabled.

For the second selection module 1_2, the signals of the three input terminals of its first AND gate C are respectively all "1," therefore the signal of the output terminal of the first AND gate C, i.e., the first input terminal of the OR gate B is "1;" the signals of the three input terminals of the second AND gate D are all "0," therefore the output terminals of the second AND gate D, i.e., the second input terminal of the OR gate B is "0;" because the signals of the two input terminals of the OR gate B are respectively "1" and "0," the signal of the output terminal of the OR gate B, i.e., the enable terminal Out_2 corresponding to the second selection module 1_2 is "1," i.e., the enable terminal Out_2 corresponding to the second selection module 1_2 is enabled.

For the third selection module 1_3, the signals of the three input terminals of its first AND gate C are respectively "1," "0" and "0," therefore the output terminal of the first AND gate C, i.e., the first input terminal of the OR gate B is "0;" the signals of the three input terminals of the second AND gate D are respectively "0," "1," "1," therefore the signals of the output terminal of the second AND gate D, i.e., the second input terminal of the OR gate B is "0;" because the signals of the two input terminals of the OR gate B are all "0," the signal of the output terminal of the OR gate B, i.e., the enable terminal Out_3 corresponding to the third selec-

TABLE 2

| In_1 = 0 | | | | | | In_2 = 1 | | | | | | In_3 = 1 | | | | | |
|---|---|---|---|---|---|---|---|---|---|---|---|---|---|---|---|---|---|
| 1_1 | | | | | | 1_2 | | | | | | 1_3 | | | | | |
| c1 | c2 | c3 | d1 | d2 | d3 | c1 | c2 | c3 | d1 | d2 | d3 | c1 | c2 | c3 | d1 | d2 | d3 |
| 0 | 0 | 0 | 1 | 1 | 1 | 1 | 1 | 0 | 0 | 0 | 1 | 1 | 0 | 1 | 0 | 1 | 0 |
| b1 | | | b2 | | | b1 | | | b2 | | | b1 | | | b2 | | |
| 0 | | | 1 | | | 0 | | | 0 | | | 0 | | | 0 | | |
| Out_1 | | | | | | Out_2 | | | | | | Out_3 | | | | | |
| 1 | | | | | | 0 | | | | | | 0 | | | | | |

In the third case: when In_1=0, In_2=1, In_3=0:

For the first selection module 1_1, signals of the three input terminals of its first AND gate C are respectively "0," "0," and "1," therefore the signal of the output terminal of the first AND gate C, i.e. the first input terminal of the OR tion module 1_3 is "0," i.e., the enable terminal Out_3 corresponding to the third selection module 1_3 is not enabled.

Specifically, the input signal of each gate of each of the selection modules is shown in table 3 below.

TABLE 3

| In_1 = 0 | | | | | | In_2 = 1 | | | | | | In_3 = 0 | | | | | |
|---|---|---|---|---|---|---|---|---|---|---|---|---|---|---|---|---|---|
| 1_1 | | | | | | 1_2 | | | | | | 1_3 | | | | | |
| c1 | c2 | c3 | d1 | d2 | d3 | c1 | c2 | c3 | d1 | d2 | d3 | c1 | c2 | c3 | d1 | d2 | d3 |
| 0 | 0 | 1 | 1 | 1 | 0 | 1 | 1 | 1 | 0 | 0 | 0 | 1 | 0 | 0 | 0 | 1 | 1 |

TABLE 3-continued

| b1 | b2 | b1 | b2 | b1 | b2 |
|----|----|----|----|----|----|
| 0  | 0  | 1  | 0  | 0  | 0  |
| Out_1 | | Out_2 | | Out_3 | |
| 0 | | 1 | | 0 | |

In the fourth case: when In_1=1, In_2=0, In_3=1:

For the first selection module 1_1, signals of the three input terminals of its first AND gate C are respectively "1," "1" and "0," therefore the signal of the output terminal of the first AND gate C, i.e., the first input terminal of the OR gate B is "0;" the signals of the three input terminals of the second AND gate D are respectively "0," "0," and "1," therefore, the signal of the output terminal of the second AND gate D, i.e., the second input terminal of the OR gate B is "0;" since the signals of the two input terminals of the OR gate B are all "0," the signal of the output terminal of the OR gate B, i.e., the enable terminal Out_1 corresponding to the first selection module 1_1 is "0," i.e., the enable terminal Out_1 corresponding to the first selection module 1_1 is not enabled.

For the second selection module 1_2, the signals of the three input terminals of its first AND gate C are respectively all "0," therefore the signal of the output terminal of the first AND gate C, i.e., the first input terminal of the OR gate B is "0;" the signals of the three input terminals of the second AND gate D are all "1," therefore the output terminals of the second AND gate D, i.e., the second input terminal of the OR gate B is "1;" since the signals of the two input terminals of the OR gate B are respectively "0" and "1," the signal of the output terminal of the OR gate B, i.e., the enable terminal Out_2 corresponding to the second selection module 1_2 is "1," i.e., the enable terminal Out_2 corresponding to the second selection module 1_2 is enabled.

For the third selection module 1_3, the signals of the three input terminals of its first AND gate C are respectively "0," "1," and "1," therefore the output terminal of the first AND gate C, i.e., the first input terminal of the OR gate B is "0;" the signals of the three input terminals of the second AND gate D are respectively "1," "0," and "0," therefore the signals of the output terminal of the second AND gate D, i.e., the second input terminal of the OR gate B is "0;" since the signals of the two input terminals of the OR gate B are all "0," the signal of the output terminal of the OR gate B, i.e., the enable terminal Out_3 corresponding to the third selection module 1_3 is "0," i.e., the enable terminal Out_3 corresponding to the third selection module 1_3 is not enabled.

Specifically, the input signal of each gate of each of the selection modules is shown in table 4 below.

In the fifth case: when In_1=0, In_2=0, In_3=1:

For the first selection module 1_1, signals of the three input terminals of its first AND gate C are respectively "0," "1," and "0," therefore the signal of the output terminal of the first AND gate C, i.e., the first input terminal of the OR gate B is "0;" the signals of the three input terminals of the second AND gate D are respectively "1," "0," and "1," therefore, the signal of the output terminal of the second AND gate D, i.e., the second input terminal of the OR gate B is "0;" since the signals of the two input terminals of the OR gate B are all "0," the signal of the output terminal of the OR gate B, i.e., the enable terminal Out_1 corresponding to the first selection module 1_1 is "0," i.e., the enable terminal Out_1 corresponding to the first selection module 1_1 is not enabled.

For the second selection module 1_2, the signals of the three input terminals of its first AND gate C are respectively "1," "0" and "0," therefore the signal of the output terminal of the first AND gate C, i.e., the first input terminal of the OR gate B is "0;" the signals of the three input terminals of the second AND gate D are respectively "0," "1," and "1," therefore the output terminals of the second AND gate D, i.e., the second input terminal of the OR gate B is "0;" since the signals of the two input terminals of the OR gate B are all "0," the signal of the output terminal of the OR gate B, i.e., the enable terminal Out_2 corresponding to the second selection module 1_2 is "0," i.e., the enable terminal Out_2 corresponding to the second selection module 1_2 is not enabled.

For the third selection module 1_3, the signals of the three input terminals of its first AND gate C are all "1," therefore the output terminal of the first AND gate C, i.e., the first input terminal of the OR gate B is "1;" the signals of the three input terminals of the second AND gate D are all "0," therefore the signals of the output terminal of the second AND gate D, i.e., the second input terminal of the OR gate B is "0;" because the signals of the two input terminals of the OR gate B are respectively "1" and "0," the signal of the output terminal of the OR gate B, i.e., the enable terminal Out_3 corresponding to the third selection module 1_3 is "1," i.e., the enable terminal Out_3 corresponding to the third selection module 1_3 is enabled.

TABLE 4

| In_1 = 1 | | | | | | In_2 = 0 | | | | | | In_3 = 1 | | | | | |
|---|---|---|---|---|---|---|---|---|---|---|---|---|---|---|---|---|---|
| 1_1 | | | | | | 1_2 | | | | | | 1_3 | | | | | |
| c1 | c2 | c3 | d1 | d2 | d3 | c1 | c2 | c3 | d1 | d2 | d3 | c1 | c2 | c3 | d1 | d2 | d3 |
| 1 | 1 | 0 | 0 | 0 | 1 | 0 | 0 | 0 | 1 | 1 | 1 | 0 | 1 | 1 | 1 | 0 | 0 |
| b1 | | b2 | | | | b1 | | b2 | | | | b1 | | b2 | | | |
| 0 | | 0 | | | | 0 | | 1 | | | | 0 | | 0 | | | |
| Out_1 | | | | | | Out_2 | | | | | | Out_3 | | | | | |
| 0 | | | | | | 1 | | | | | | 0 | | | | | |

Specifically, the input signal of each gate of each of the selection modules is shown in Table 5 below.

TABLE 5

| In_1 = 0 | | | | | | In_2 = 0 | | | | | | In_3 = 1 | | | | | |
|---|---|---|---|---|---|---|---|---|---|---|---|---|---|---|---|---|---|
| 1_1 | | | | | | 1_2 | | | | | | 1_3 | | | | | |
| c1 | c2 | c3 | d1 | d2 | d3 | c1 | c2 | c3 | d1 | d2 | d3 | c1 | c2 | c3 | d1 | d2 | d3 |
| 0 | 1 | 0 | 1 | 0 | 1 | 1 | 0 | 0 | 0 | 1 | 1 | 1 | 1 | 1 | 0 | 0 | 0 |
| b1 | | | b2 | | | b1 | | | b2 | | | b1 | | | b2 | | |
| 0 | | | 0 | | | 0 | | | 0 | | | 1 | | | 0 | | |
| Out_1 | | | | | | Out_2 | | | | | | Out_3 | | | | | |
| 0 | | | | | | 0 | | | | | | 1 | | | | | |

In the sixth case, when In_1=1, In_2=1, In_3=0:

For the first selection module 1_1, signals of the three input terminals of its first AND gate C are respectively "1," "0," and "1," therefore the signal of the output terminal of the first AND gate C, i.e. the first input terminal of the OR gate B is "0;" the signals of the three input terminals of the second AND gate D are respectively "0," "1," and "0," therefore, the signal of the output terminal of the second AND gate D, i.e., the second input terminal of the OR gate B is "0;" since the signals of the two input terminals of the OR gate B are all "0," the signal of the output terminal of the OR gate B, i.e., the enable terminal Out_1 corresponding to the first selection module 1_1 is "0," i.e., the enable terminal Out_1 corresponding to the first selection module 1_1 is not enabled.

For the second selection module 1_2, the signals of the three input terminals of its first AND gate C are respectively "0," "1," and "1," therefore the signal of the output terminal of the first AND gate C, i.e., the first input terminal of the OR gate B is "0;" the signals of the three input terminals of the second AND gate D are respectively "1," "0," and "0," therefore the output terminals of the second AND gate D, i.e., the second input terminal of the OR gate B is "0;" since the signals of the two input terminals of the OR gate B are all "0," the signal of the output terminal of the OR gate B, i.e., the enable terminal Out_2 corresponding to the second selection module 1_2 is "0," i.e., the enable terminal Out_2 corresponding to the second selection module 1_2 is not enabled.

For the third selection module 1_3, the signals of the three input terminals of its first AND gate C are all "0," therefore the output terminal of the first AND gate C, i.e., the first input terminal of the OR gate B is "0;" the signals of the three input terminals of the second AND gate D are all "1," therefore the signals of the output terminal of the second AND gate D, i.e., the second input terminal of the OR gate B is "1;" since the signals of the two input terminals of the OR gate B are respectively "0" and "1," the signal of the output terminal of the OR gate B, i.e., the enable terminal Out_3 corresponding to the third selection module 1_3 is "1," i.e., the enable terminal Out_3 corresponding to the third selection module 1_3 is enabled.

Specifically, the input signal of each gate of each of the selection modules is shown in Table 6 below.

TABLE 6

| In_1 = 1 | | | | | | In_2 = 1 | | | | | | In_3 = 0 | | | | | |
|---|---|---|---|---|---|---|---|---|---|---|---|---|---|---|---|---|---|
| 1_1 | | | | | | 1_2 | | | | | | 1_3 | | | | | |
| c1 | c2 | c3 | d1 | d2 | d3 | c1 | c2 | c3 | d1 | d2 | d3 | c1 | c2 | c3 | d1 | d2 | d3 |
| 1 | 0 | 1 | 0 | 1 | 0 | 0 | 1 | 1 | 1 | 0 | 0 | 0 | 0 | 0 | 1 | 1 | 1 |
| b1 | | | b2 | | | b1 | | | b2 | | | b1 | | | b2 | | |
| 0 | | | 0 | | | 0 | | | 0 | | | 0 | | | 1 | | |
| Out_1 | | | | | | Out_2 | | | | | | Out_3 | | | | | |
| 0 | | | | | | 0 | | | | | | 1 | | | | | |

It should be noted that, in Table 1-Table 6, c1, c2 and c3 respectively represent the first input terminal, the second input terminal, and the third input terminal of the first AND gate C, d1, d2 and d3 respectively represent the first input terminal, the second input terminal, and the third input terminal of the second AND gate D, and b1 and b2 respectively represent the first input terminal and the second input terminal of the OR gate B.

Figure 3:
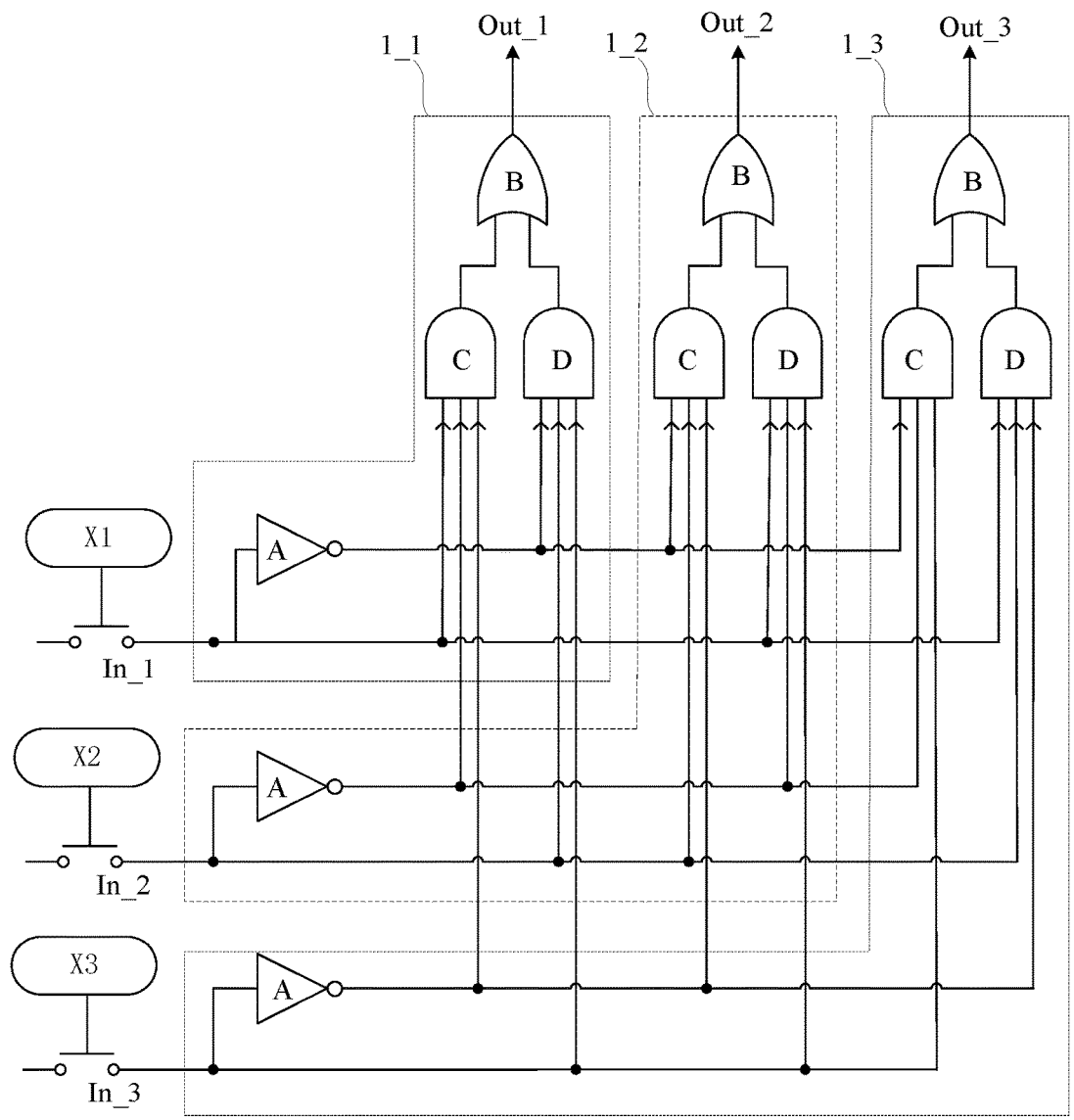
FIG. 3 is a schematic view of an electronic device according to some embodiments.

Based on the same inventive conception, embodiments of the present disclosure also provide an electronic device. As illustrated in FIG. 3, the electronic device comprises at least N function keys: X1, X2, . . . , Xn, . . . , XN (in the example shown in FIG. 3, N=3), and further comprises the selection modules described above according to some embodiments of the present disclosure. Each control terminal In_n corresponds to a function key Xn.

For the electronic device according to some embodiments, when the function key corresponding to the control terminal of the selection module is turned on, the "on" signal is output to the corresponding control terminal.

In some embodiments, the electronic device can be a mobile phone, a laptop computer, a tablet computer, etc.

Taking a mobile phone as an example, because the volume up function key, the volume down function key, and power-on function key are used frequently, these three function keys can correspond to the selection module. That is, in the selection module, N=3, each of the three control terminals in the selection module respectively corresponds to the volume-up function key, the volume-down function key, and the power-on function key of the mobile phone.

Embodiments of the present disclosure provide a selection circuit and an electronic device, comprising: N selection modules, N control terminals, and enable terminals corresponding respectively to each selection module respectively; wherein, N is an integer greater than and equal to 3; for each selection module, among the N control terminals one and only one is the corresponding first control terminal; among the remaining of the control terminals, at least two control terminals are the corresponding second control terminal. Different selection modules correspond to different first control terminals, different selection modules correspond to different combinations of second control terminals. Because each selection module enables the enable terminal corresponding to the selection module not only if the first control terminal receives an "on" signal, but also if all the corresponding second control terminals receive an "on" signal in the case the first control terminal corresponding to the selection module is broken.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A selection circuit, comprising:
   N control terminals;
   N selection modules; and
   N enable terminals configured to enable respectively the N selection modules; wherein:
   N is an integer greater than or equal to 3;
   a first group of the at least three control terminals is configured to control one or more of the N selection modules to provide a first signal for controlling a first function;
   a second group of the at least three control terminals is configured to control one or more of the N selection modules to provide a second signal for controlling the first function;
   the first group comprises only one of the N control terminals;
   the second group comprises at least two other control terminals of the N control terminals;
   each of the N selection modules has, among the N control terminals, only one control terminal as a first control terminal, and at least two other control terminals as second terminals;
   different selection modules correspond to different first control terminals;
   different selection modules correspond to different combinations of second control terminals;
   each selection module is configured to enable a corresponding enable terminal if only one following condition is satisfied:
   its first control terminal receives an "on" signal, or
   each of its second control terminals receives an "on" signal;
   each of the N selection module has a same number of N−1 second control terminals;
   each of the N selection modules comprises: a NOT gate, an OR gate, a first AND gate, and a second AND gate;
   the first AND gate and the second AND gate each has N input terminals;
   for an n-th selection module with n being an integer between 1 and N:
   its first control terminal is respectively coupled with the input terminal of the NAND gate of the n-th selection module, the n-th input terminal of the first AND gate of the n-th selection module, and the n-th input terminal of the second AND gate of the selection modules other than the n-th selection module;
   the output terminal of the NAND gate of the n-th selection module is respectively coupled with the n-th input terminal of the second AND gate of the n-th selection module, and the n-th input terminal of the first AND gate of selection modules other than the n-th selection module;
   the output terminal of the first AND gate of n-th selection module is coupled with the first input terminal of the OR gate of the n-th selection module, the output terminal of the second AND gate of n-th selection module is coupled with the second input terminal of the OR gate of the n-th selection module, the output terminal of the OR gate is coupled with the enable terminal corresponding to the n-th selection module.

2. The selection circuit of claim 1, wherein N=3.

3. A selection circuit, comprising:
   three control terminals;
   three selection modules; and
   three enable terminals configured to enable respectively the three selection modules; wherein:
   a first group of the three control terminals is configured to control one or more of the three selection modules to provide a first signal for controlling a first function;
   a second group of the at least three control terminals is configured to control one or more of the three selection modules to provide a second signal for controlling the first function;
   the first group comprises only one of the three control terminals;
   the second group comprises two other control terminals of the three control terminals;
   each of the three selection modules has, among the three control terminals, only one control terminal as its first control terminal, and two other control terminals as its second terminals;
   different selection modules correspond to different first control terminals;

different selection modules correspond to different combinations of second control terminals;

each selection module is configured to enable a corresponding enable terminal if only one following condition is satisfied:

its first control terminal receives an "on" signal, or each of its second control terminals receives an "on" signal;

each enable terminal is configured to be enabled through at least two methods including:

engaging corresponding first control terminal and disengaging all the second control terminals; or disengaging corresponding first control terminal and engaging all corresponding second control terminals.

4. The selection circuit of claim 3, wherein:

an n-th selection terminal is the first control terminal of the n-th selection module;

a state of enable terminal Out_1 is a';

a state of enable terminal Out_2 is b';

a state of enable terminal Out_3 is c';

a state of control terminal In_1 is a;

a state of control terminal In_2 is b;

a state of control terminal In_1 is c;

state logic function expressions of the enable terminals and the control terminals include: $a'=a\overline{bc}+\overline{a}bc$, $b'=\overline{a}b\overline{c}+a\overline{b}c$, $c'=\overline{abc}+abc$.

5. An electronic device, comprising:

at least N function keys;

a selection circuit comprising:

at least three control terminals; and at least three selection modules; wherein:

a first group of the at least three control terminals is configured to control one or more of the at least three selection modules to provide a first signal for controlling a first function; and a second group of the at least three control terminals is also configured to control one or more of the at least three selection modules provide a second signal for controlling the first function;

wherein each of the control terminals of the selection circuit corresponds to one of the function keys.

6. The electronic device of claim 5, wherein the electronic device comprises at least one of a mobile phone, a laptop computer, or a tablet computer.

7. The electronic device of claim 6, wherein the electronic device is a mobile phone.

8. The electronic device of claim 5, wherein for N=3, the three control terminals of the selection circuit correspond respectively to a volume up function key, a volume down function key, and a power on/off function key.

9. The electronic device of claim 8, wherein the volume up function key, the volume down function key, and the power on/off function key are physical keys.

10. The electronic device of claim 8, wherein the volume up function key, the volume down function key, and the power on/off function key are soft keys on a touch screen of the electronic device.

11. A method of controlling an electronic apparatus, wherein the electronic apparatus has at least three function keys, the method comprising:

selecting at least two function keys of the at least three function keys to realize a first function of a first function key;

wherein the first function corresponds to the first function key; and wherein the electronic apparatus further comprises a selection circuit, including:

at least three control terminals; and at least three selection modules; wherein:

a first group of the at least three control terminals is configured to control one or more of the at least three selection modules to provide a first signal for controlling the first function; and a second group of the at least three control terminals is also configured to control one or more of the at least three selection modules to provide a second signal for controlling the first function.

12. The method of claim 11, wherein each of the at least three function keys corresponds to different functions.

13. The method of claim 12, wherein the at least three function keys correspond respectively to a volume up function, a volume down function, and a power on/off function.

14. The method of claim 13, further comprising selecting both the volume up function key and the volume down function key to realize the power on/off function.

* * * * *